(12) United States Patent
Hsieh (10) Patent No.: US 7,917,830 B2
(45) Date of Patent: Mar. 29, 2011

(54) TURBO DECODER AND ITERATION STOPPING METHOD THEREOF

(75) Inventor: Chung-Hsien Hsieh, Taipei (TW)

(73) Assignee: Via Technologies, Inc., Hsin-Tien, Taipei (TW)

( * ) Notice: Subject to any disclaimer, the term of this patent is extended or adjusted under 35 U.S.C. 154(b) by 851 days.

(21) Appl. No.: 11/863,301

(22) Filed: Sep. 28, 2007

(65) Prior Publication Data

US 2009/0089643 A1 Apr. 2, 2009

(51) Int. Cl.
*H03M 13/00* (2006.01)
(52) U.S. Cl. .................. 714/755; 714/786; 375/341
(58) Field of Classification Search ............. 714/755, 714/786; 375/341
See application file for complete search history.

(56) References Cited

U.S. PATENT DOCUMENTS

| | | | | |
|---|---|---|---|---|
| 6,161,209 | A * | 12/2000 | Moher ..................... | 714/780 |
| 6,732,327 | B1 | 5/2004 | Heinila | |
| 6,738,948 | B2 | 5/2004 | Dinc et al. | |
| 6,879,648 | B2 | 4/2005 | Ebel, Sr. | |
| 6,888,901 | B2 | 5/2005 | Yu et al. | |
| 6,898,254 | B2 | 5/2005 | Wolf et al. | |
| 7,096,402 | B2 | 8/2006 | Yano et al. | |
| 7,127,656 | B2 * | 10/2006 | Van Stralen et al. .......... | 714/755 |
| 7,266,756 | B2 * | 9/2007 | Saado et al. ................ | 714/790 |
| 7,383,484 | B2 * | 6/2008 | Yeh et al. ................... | 714/780 |
| 7,421,041 | B2 * | 9/2008 | Khandekar et al. ........... | 375/316 |
| 7,580,469 | B2 * | 8/2009 | Yonesi et al. ............... | 375/262 |
| 7,660,231 | B2 * | 2/2010 | Tulino ........................ | 370/203 |
| 2003/0066018 | A1 | 4/2003 | Yu et al. | |
| 2004/0260995 | A1 | 12/2004 | Allpress | |
| 2005/0015696 | A1 | 1/2005 | Bune | |
| 2006/0005100 | A1 | 1/2006 | Bass | |

FOREIGN PATENT DOCUMENTS

| | | |
|---|---|---|
| CN | 1996765 | 7/2007 |
| EP | 1447936 | 8/2004 |

OTHER PUBLICATIONS

English abstract of CN1996765.

* cited by examiner

*Primary Examiner* — Esaw T Abraham
(74) *Attorney, Agent, or Firm* — Thomas | Kayden (57) ABSTRACT

A turbo decoder includes first and second interleavers, a de-interleaver, first and second component decoders and a stop judging circuit. The first and second component decoders respectively decode a systematic code and an interleaved systematic code into first and second extrinsic information. The de-interleaver, the first and second data interleavers respectively process the second extrinsic information, the systematic code and the first extrinsic information into a first a-priori information, an interleaved systematic code and the second a-priori information. The stop judging circuit includes a signal selector, a difference detector and a comparator. The signal selector outputs the first extrinsic information and the first a-priori information or the second extrinsic information and the second a-priori information. The difference detector and comparator respectively get a difference between two output data of the signal selector and output a stopping signal to stop the iteration when the difference is smaller than a threshold value.

15 Claims, 5 Drawing Sheets

TURBO DECODER AND ITERATION STOPPING METHOD THEREOF

BACKGROUND OF THE INVENTION

1. Field of the Invention

The invention relates in general to a turbo decoder, and more particularly to a turbo decoder capable of judging whether decoded data is converge every time when one half iteration of the decoding is finished, and stopping the iteration if the decoded data is converge.

2. Description of the Related Art

Turbo coding is an error-correcting code technique applied to a data transmission and communication system, in which a turbo decoder has, for example, two or more than two component decoders disposed in parallel, and one or more than one interleavers and de-interleavers disposed between the component decoders. First component decoder receives a systematic and first parity code and then performs decoding. Then it generates first extrinsic information and feeds it to a first interleaver. The first interleaver generates the interleaved extrinsic information and feeds this to second component decoder. The second interleaver processes the systematic code and outputs interleaved systematic code. Then the second component decoder uses the interleaved extrinsic information as its a-priori information and then uses the interleaved systematic code and second parity code to perform decoding. After second component decoding, it will also generate extrinsic information. Now, one iteration is completed for this moment. The extrinsic information generated by second component decoder will be fed to de-interleaver and the first component decoder will take the de-interleaved extrinsic information as it's a-priori information and start the next iteration. After several complete iterations, the correct decoded data can be derived.

However, the conventional turbo decoding system often performs the redundant iteration continuously after the decoded data already converges. Because one iteration consumes a lot of time and a lot of computing power, the conventional turbo decoder has the problems of consuming longer decoding time and heavier system computing power. As for the conventional turbo decoding system disposed in a handheld apparatus, the problem of seriously shortening the battery durability of the handheld apparatus occurs. Thus, it is an important subject to design a turbo decoding system capable of stopping the iteration immediately when the correct decoded data is converge.

SUMMARY OF THE INVENTION

The invention is directed to a turbo decoder and an iteration stopping method thereof, wherein the turbo decoder can effectively improve the drawbacks occurred in the conventional turbo decoder which consumes the longer decoding time and the greater system computing power, and can effectively improve the drawback of the poor battery durability of the handheld apparatus having the conventional turbo decoder. Thus, the advantages of the shorter decoding time, the smaller system computing power and the better battery durability of the handheld apparatus can be obtained.

According to a first aspect of the present invention, a turbo decoder is provided. The turbo decoder receives a systematic code and two parity codes through a communication link and performs several iteration to do decoding. The turbo decoder includes first and second interleavers, a de-interleaver, first and second component decoders, and a stop judging circuit. The first component decoder gets first decoded data and extrinsic information according to systematic code, first parity code, and a-priori information. The first data interleaver receives the systematic code and interleaves the systematic code into an interleaved systematic code. The second interleaver receives the extrinsic information generated by first component decoder and use the interleaved extrinsic information to be second component decoder's a-priori information. The second component decoder gets second decoded data and extrinsic information according to the interleaved systematic code, second parity code, and the a-priori information. The extrinsic information generated by second component decoder will be fed to the de-interleaver. The de-interleaver will de-interleave the extrinsic information from second component decoder to be first component decoder's a-priori information. The stop judging circuit includes a signal selector, a difference detector and a comparator. The signal selector responds with a first level of a select signal to select the a-priori information fed to first component decoder and extrinsic information generated by first component decoder as first output data and second output data for output, and responds with a second level of the select signal to select the a-priori information fed to second component decoder and the extrinsic information generated by second component decoder as the first output data and the second output data for output. The difference detector detects the sign difference between the first output data and the second output data to get difference data. The comparator judges whether the difference data is smaller than a threshold value, and outputs a stopping signal to stop the iteration of the turbo decoder when the difference data is smaller than the threshold value.

According to a second aspect of the present invention, an iteration stopping method is provided. The method is applied to a turbo decoder to judge whether the iteration is finished and to stop the iteration thereof. The iteration stopping method includes the following steps. First, the a-priori information fed to second component decoder is calculated according to the systematic code and the first parity code and then interleaved by an interleaver. Next, difference data is calculated according to the sign difference between the a-priori information fed to second component decoder and the extrinsic information calculated by second component decoder, and it is judged whether the difference data is smaller than a threshold value. If the difference data is smaller than a threshold value, the iteration will be stopped. If the difference data is larger than threshold, the a-priori information fed to first component decoder will be calculated according to the interleaved systematic code, second parity code, and the a-priori information Then the difference data is calculated according to the sign difference between the extrinsic information calculated by first component decoder and the a-priori information fed to first component decoder. Then, it is judged that the turbo decoder has finished the decoding and the iteration is stopped when the difference data is smaller than the threshold value.

According to a third aspect of the present invention, another iteration stopping method is provided. The method is applied to a turbo decoder to judge whether the decoded data is converge, and to stop the iteration of the turbo decoder. The iteration stopping method includes the following steps. First, first decoded data and extrinsic information are calculated according to a systematic code and first parity code. Then, it is judged whether difference data, which is obtained according to a difference between the extrinsic information generated by first component decoder and the a-priori information fed to first component decoder, is smaller than a threshold value. If the difference data is smaller than threshold, the stop signal will be enabled and turbo decoder will stop decoding.

If the difference data is larger than threshold, the stop signal will be disabled and second component decoder will be started and do decoding. Then, the extrinsic information calculated again according to the interleaved systematic code, the second parity code and the a-priori information which is generated by interleaving the extrinsic information generated by first component decoder. Then, it is judged whether difference data, which is obtained according to a difference between the extrinsic information generated by second component decoder and the a-priori information fed to second component decoder, is smaller than a threshold value. If the difference data is smaller than threshold, the stop signal will be enabled. Then, the turbo decoder finishes the iteration and the iteration of the turbo decoder is stopped.

The invention will become apparent from the following detailed description of the preferred but non-limiting embodiments. The following description is made with reference to the accompanying drawings.

DETAILED DESCRIPTION OF THE INVENTION

Figure 1:
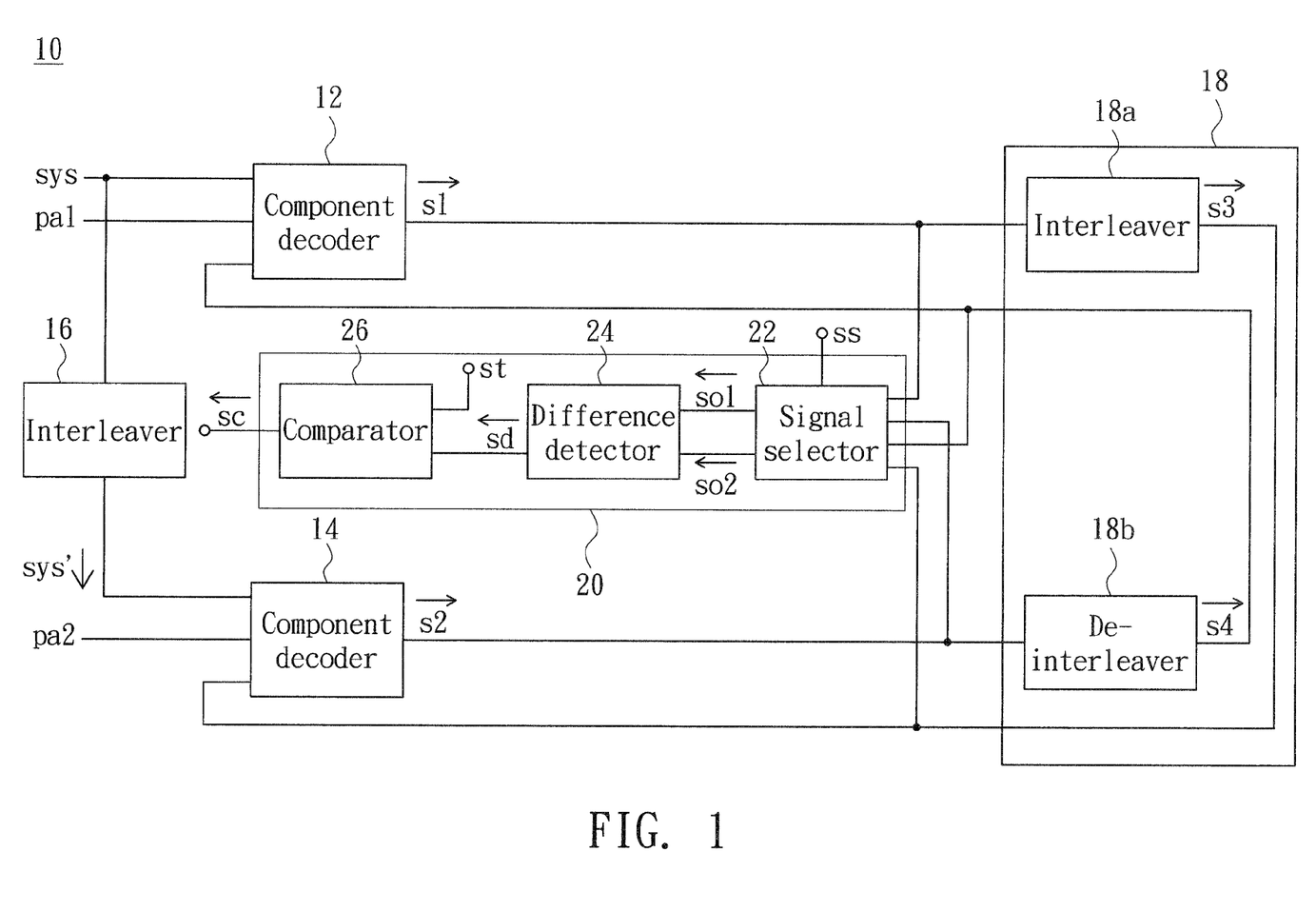
FIG. 1 is a block diagram showing a turbo decoder according to a preferred embodiment of the invention.

FIG. 1 is a block diagram showing a turbo decoder 10 according to a preferred embodiment of the invention. As shown in FIG. 1, the turbo decoder 10 receives a systematic code sys and parity codes pa1 and pa2 through a communication link (not shown) and performs decoding. The turbo decoder 10 includes component decoders 12 and 14, data processors 16 and 18, and a stop judging circuit 20.

The data processor 16 receives the systematic code sys, and processes the systematic code sys into a systematic code sys'. In this embodiment, the data processor 16 comprises, for example, an interleaver for interleaving the systematic code sys to get the interleaved systematic code sys'.

The component decoder 12 receives the systematic code sys, the parity code pa1, and the a-priori information s4 and generates the first extrinsic information s1 accordingly. The component decoder 12 outputs the first extrinsic information s1. The component decoder 14 receives the systematic code sys', the parity code pa2, and the a-priori information s3 and generates the second extrinsic information s2 accordingly. The component decoder 14 outputs the second extrinsic information s2.

In this embodiment, for example, the a-priori information s4 fed to the component decoder 12 is obtained by de-interleaving extrinsic information s2 generated by the component decoder 14. Similarly, the a-priori information s3 fed to the component decoder 14 is obtained by interleaving extrinsic information s1 generated by the component decoder 12. Every time the component decoders 12 and 14 respectively generate extrinsic information s1 and s2 is defined as one complete iteration.

The data processor 18 receives the extrinsic information s1 and s2, and processes the extrinsic information s1 and s2 into the a-priori information s3 and s4, respectively. In this embodiment, the data processor 18 includes an interleaver 18a and a de-interleaver 18b, which respectively interleave the extrinsic information s1 and de-interleave the extrinsic information s2 into the a-priori information s3 and s4. For example, the formats of the extrinsic information s1 and that of the a-priori information s4 are the original formats, and the formats of the extrinsic information s2 and s3 are the interleaved formats.

The stop judging circuit 20 includes, for example, a signal selector 22, a difference detector 24, and a comparator 26. The signal selector 22 receives the extrinsic information s1 and s2, the a-priori information s3 and s4, and a select signal ss, responds with a first level of the select signal ss to select the extrinsic information s1 and the a-priori information s4 respectively as output data so1 and so2 for output, and responds with a second level of the select signal ss to select the extrinsic information s2 and the a-priori information s3 respectively as the output data so1 and so2 for output.

The difference detector 24 receives the output data so1 and so2, and detects a difference between the output data so1 and so2 to get difference data sd. Each of the output data so1 and so2 of this embodiment has n bits, for example, and the difference detector 24 compares the n bits of the output data so1 and corresponding n bits of the output data so2 through logic operations respectively, and accumulates n compared results to get the difference data sd.

The comparator 26 receives a threshold value st and the difference data sd to judge whether the difference data sd is smaller than the threshold value st, wherein the threshold value st may be, for example, an allowable difference between extrinsic information and the a-priori information. When the difference data sd is smaller than the threshold value st, it means that the difference between the output data so1 and so2 is smaller than the allowable difference between extrinsic information and the a-priori information. That is, the values of the first and second originally extrinsic information obtained by the component decoders 12 and 14 are judged to substantially approximate to each other and respectively approximate the correct decoded data. At this time, the comparator 26 enables a stopping signal sc for the entire turbo decoder 10.

In this embodiment, the component decoders 12 and 14 are equipped with limited memories to store the extrinsic information of the component decoders 12 and 14, but not to store the decoded data. Consequently, when the stopping signal sc is enabled, the turbo decoder 10 has to calculate the decoded data through the additionally executed half iteration.

The turbo decoder 10 of this embodiment can judge whether the corresponding decoded data substantially approaches the correct value of the code at the time point when the component decoder 12 generates the extrinsic information s1 and at the time point when the component decoder 14 generates the extrinsic information s2 (i.e., when each half iteration is finished), and can thus stop the iteration of the turbo decoder 10. Consequently, the turbo decoder 10 of this embodiment can judge whether the currently generated decoded data is equal to or approaches the correct value of the code transmitted by transmitter side, and can immediately stop the iteration thereof when the decoded data approaches the correct value of the code transmitted by transmitter side. Consequently, the turbo decoder 10 of this embodiment can effectively improve the drawbacks that the conventional turbo decoder has to consume the longer decoding time and the greater system computing power.

Figure 2A:
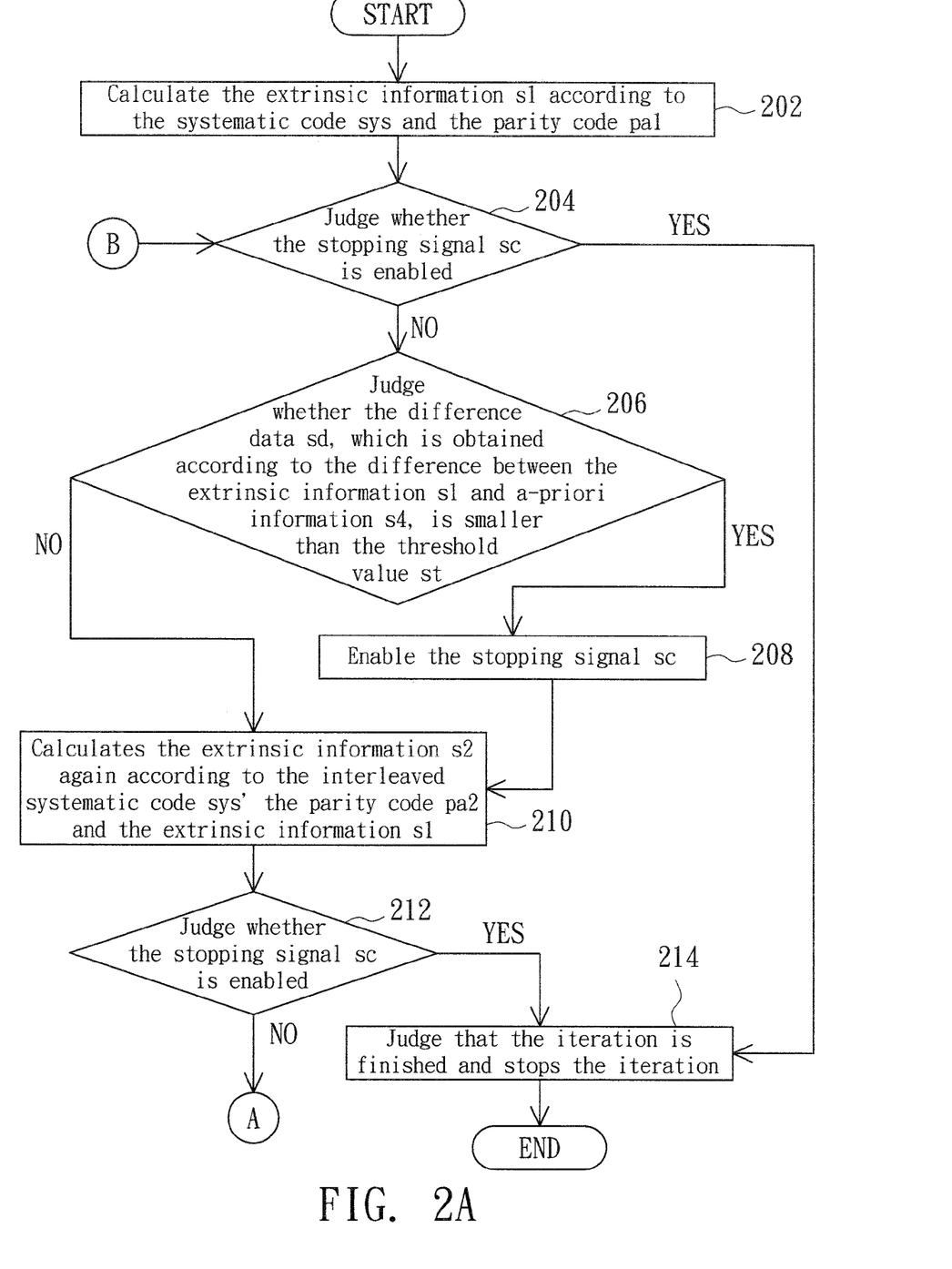
FIGS. 2A and 2B show a flow chart showing an iteration stopping method according to the preferred embodiment of the invention.
Figure 2B:
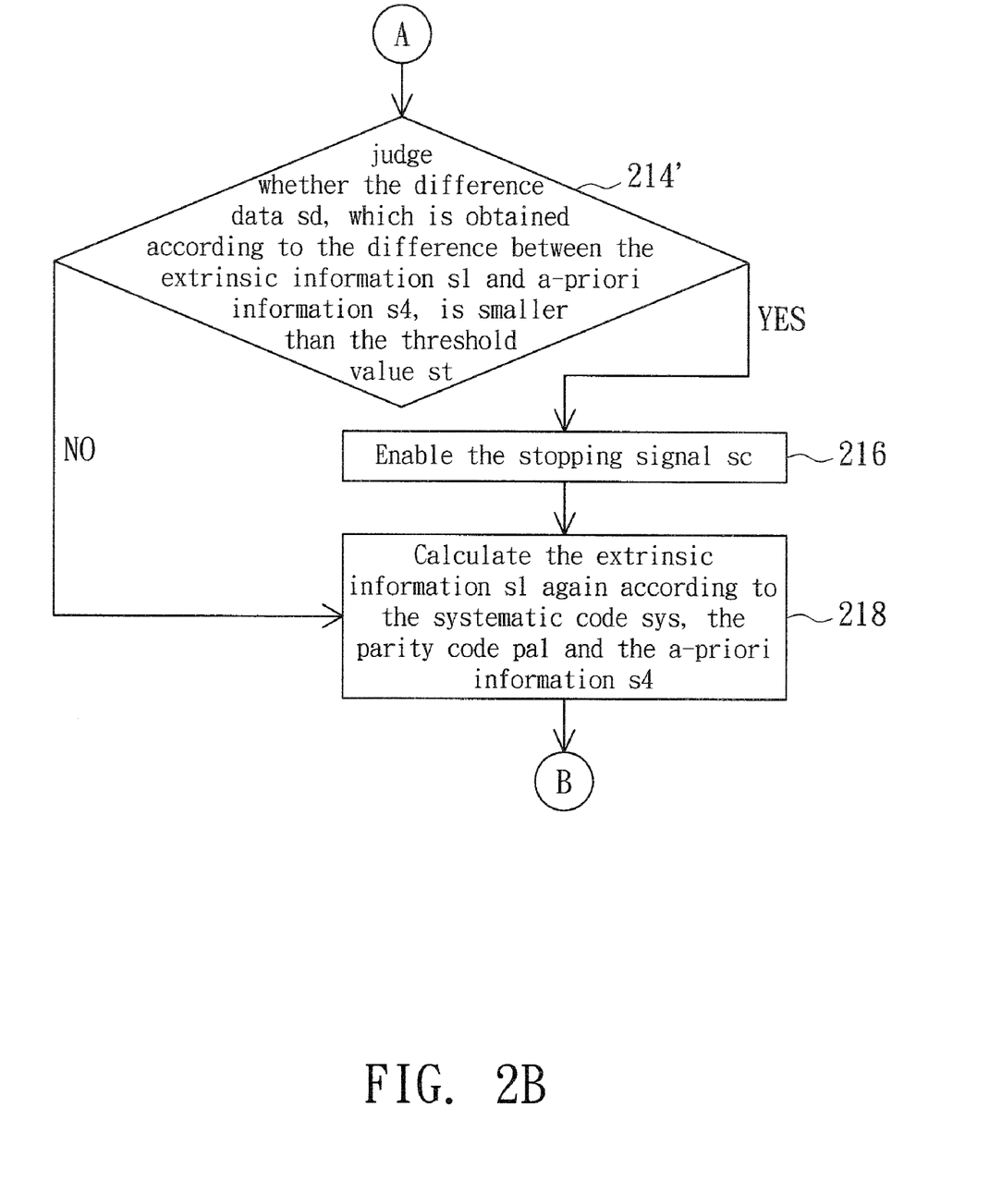

FIGS. 2A and 2B show a flow chart showing an iteration stopping method according to the preferred embodiment of the invention. First, as shown in step (202), the component decoder 12 calculates the first originally extrinsic information s1 according to the systematic code sys and the parity code pa1. Next, as shown in step (204), the turbo decoder 10 judges whether the stopping signal sc is enabled. If not, step (206) is performed, and the stop judging circuit 20 judges whether the difference data sd, which is obtained according to the difference between the extrinsic information s1 and the a-priori information s4, is smaller than the threshold value st. The stop judging circuit 20 selects the decoded data s1 and s4 through the signal selector 22, and calculates the difference data sd through a logic unit 24a and an accumulator 24b. If yes, step (208) is performed and the stop judging circuit 20 enables the stopping signal sc.

Next, as shown in step (210), the component decoder 14 calculates the decoded data s2 again according to the interleaved systematic code sys', the parity code pa2 and the a-priori information s3. Then, as shown in step (212), the turbo decoder 10 judges whether the stopping signal sc is enabled. If yes, step (214) is performed and the turbo decoder 10 judges that the iteration is finished and stops the decoding.

In step (212), if the stopping signal sc is judged as being disabled, step (214') is performed and the stop judging circuit 20 judges whether the difference data sd, which is obtained according to the difference between the decoded data s2 and s3, is smaller than the threshold value st. If yes, step (216) is performed, and the stop judging circuit 20 enables the stopping signal sc. Next, as shown in step (218), the component decoder 12 calculates the extrinsic information s1 again according to the systematic code sys, the parity code pa1 and the decoded data s4, and then step (204) is performed.

After step (214'), if it is judged that the difference data sd obtained according to the extrinsic information s2 and the a-priori information s3 is greater than the threshold value st, the method skips step (216) and directly performs step (218). After step (206), if it is judged that the difference data sd is greater than the threshold value st, the method skips step (208) and directly performs step (210). After step (202), if it is judged that the stopping signal sc is enabled, the method performs step (214).

In this embodiment, the turbo decoder 10 including the two component decoders 12 and 14 for performing the iteration is described. However, the turbo decoder 10 of this embodiment is not restricted to the use of two component decoders. Instead, three or more than three component decoders can be used to perform the iteration in accordance with the present invention.

In this embodiment, the illustrated example is directed to the component decoders 12 and 14 including are equipped with limited memories the limited memories to store the extrinsic information of the component decoders 12 and 14, but not to store the decoded data. Consequently, when the stopping signal sc is enabled, the turbo decoder 10 has to calculate the decoded data through the additionally executed half iteration. However, the component decoders 12 and 14 of this embodiment may also be equipped with larger memories which can store the decoded data in every half iteration. Consequently, when the turbo decoder 10 receives the enabled stopping signal sc, it can directly stop the iteration without additionally performing the half iteration.

Figure 3:
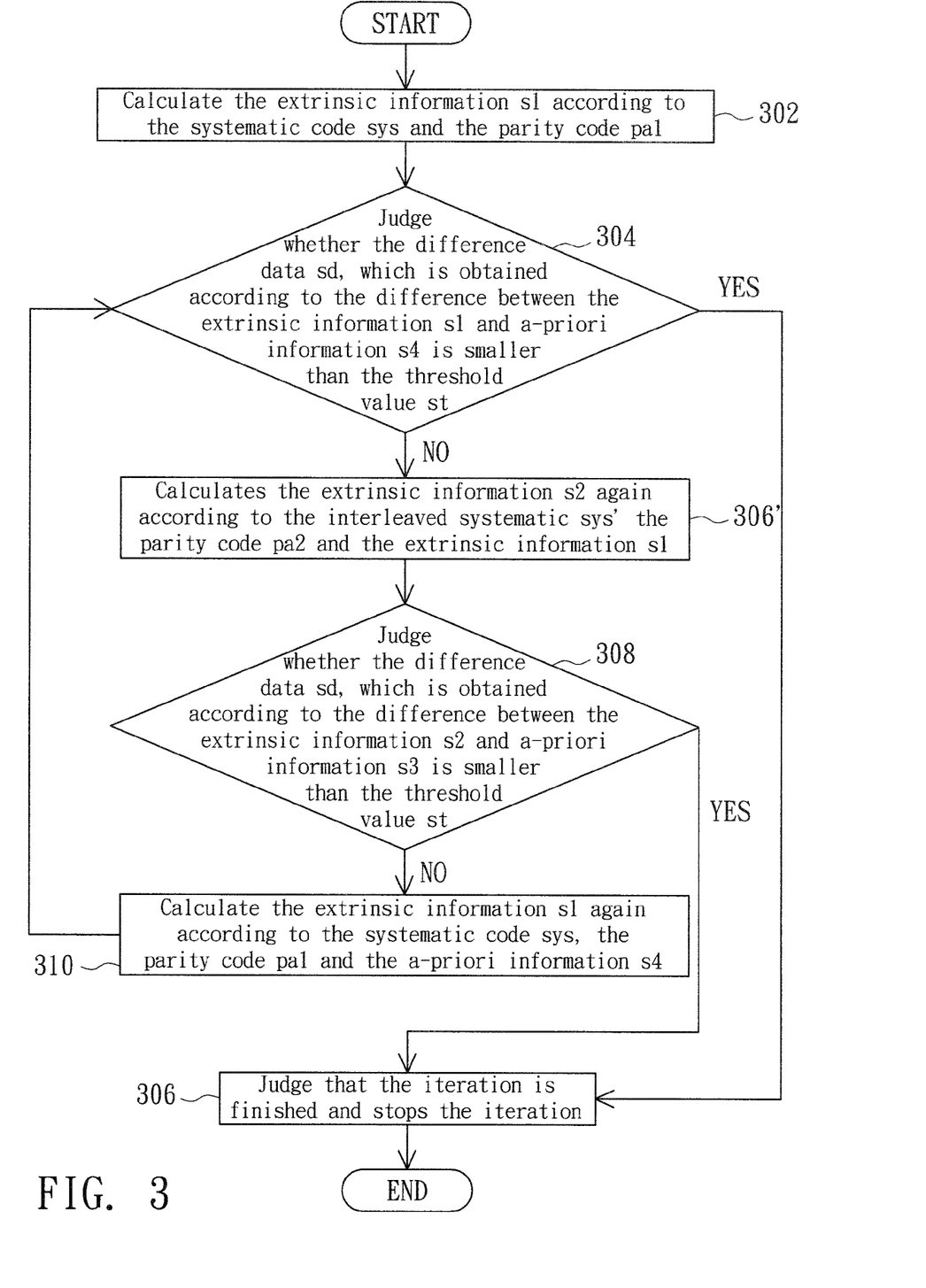
FIG. 3 is a flow chart showing another iteration stopping method according to the preferred embodiment of the invention.

In this embodiment, illustrations are made by taking the corresponding flow of the iteration stopping method as an example. The method includes the mechanism including the steps of enabling the stopping signal sc and judging whether the stopping signal sc is enabled so as to control the turbo decoder 10 of this embodiment to perform the half iteration additionally when the first or second originally decoded data is substantially correct. However, when the component decoders 12 and 14 of this embodiment have the sufficient memory to store the decoded data, the mechanism including the steps of enabling the stopping signal sc and judging whether the stopping signal sc is enabled can be eliminated from the iteration stopping method of this embodiment so that the substantially approximating effect may be obtained. FIG. 3 is a flow chart showing another iteration stopping method according to the preferred embodiment of the invention. As shown in FIG. 3, the mechanism of FIGS. 2A and 2B, which includes the steps of enabling the stopping signal sc and judging whether the stopping signal sc is enabled, is omitted, and the iteration is judged and stopped directly according to the difference data sd and the threshold value st.

Figure 5:
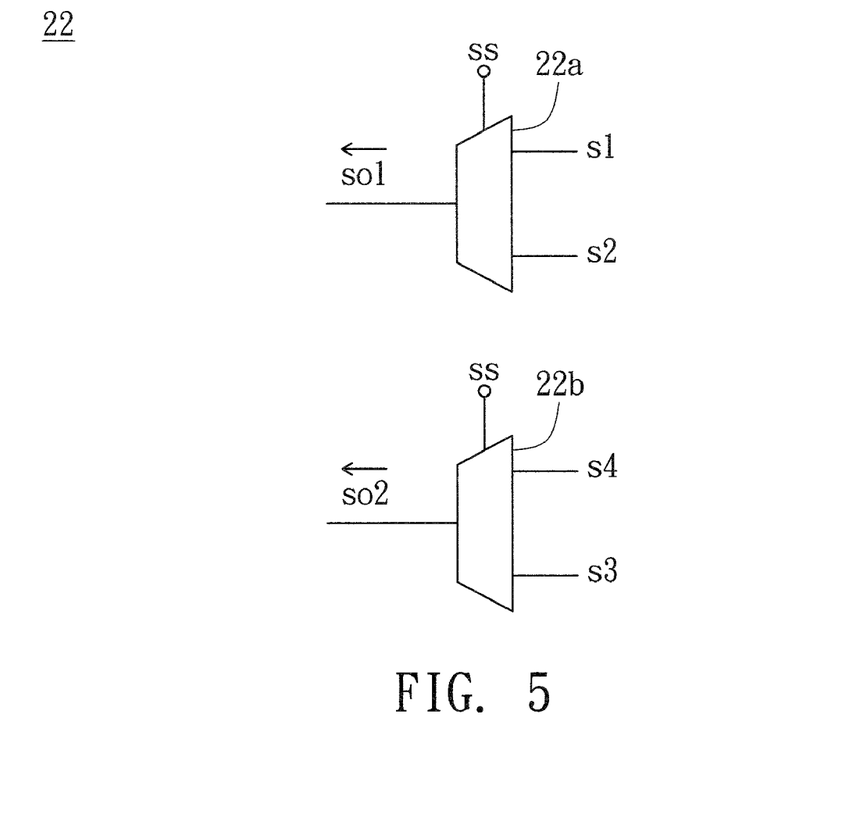
FIG. 5 is a detailed block diagram showing a difference detector 24 of FIG. 1.

The signal selector 22 of this embodiment may be implemented through a multiplexer (Mux), for example, as shown in FIG. 5. The multiplexers 22a and 22b receive the select signal ss, respond with the first level thereof to respectively output the decoded data s1 and s4, and respond with the second level thereof to respectively output the decoded data s3 and s2. The level of the select signal ss of this embodiment is controlled by the component decoders 12 and 14, for example. When the component decoder 12 generates the extrinsic information s1, the component decoder 12 controls the select signal ss to be equal to the first level in order to control the multiplexers 22a and 22b to respectively output the extrinsic information s1 and the a-priori information s4. When the component decoder 14 generates the extrinsic information s2, the component decoder 14 controls the select signal ss to be equal to the second level in order to control the multiplexers 22a and 22b to respectively output the extrinsic information s2 and the a-priori information s3.

Figure 4:
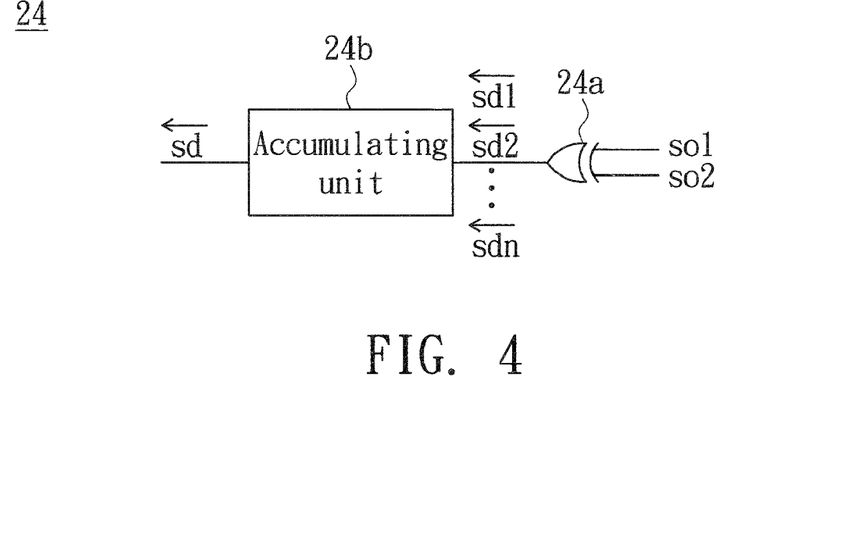
FIG. 4 is a detailed block diagram showing a signal selector 22 of FIG. 1.

The difference detector 24 of this embodiment has, for example, a logic unit 24a and an accumulating unit 24b, as shown in FIG. 4. The logic unit 24a performs an XOR (Exclusive OR) operation according to the output data so1 and so2 in order to detect differences sd1 to sdn between n bits in the output data so1 and the corresponding bits in the output data so2. The accumulating unit 24b accumulates the differences sd1 to sdn to obtain the difference data sd. In this embodiment, the logic unit 24a is an XOR logic gate, for example.

The turbo decoder of the embodiment has the stop judging circuit to judge whether the generated decoded data is the same or approaches the correct value of the code transmitted by transmitter after every half iteration is performed, and to stop the iteration when the extrinsic information approximates the a-priori information. Consequently, the turbo decoder of this embodiment can effectively eliminate the drawbacks in the conventional turbo decoder, which consumes the longer time and the larger system computing power, and can effectively eliminate the drawbacks in the turbo decoder, which has the conventional turbo decoder and thus the poor battery durability. Thus, the handheld apparatus equipped with the turbo decoder of the invention substantially has the advantages of the shorter decoding time, the less system computing power, and the better battery durability.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A turbo decoder for receiving a systematic code, a first parity code, and a second parity code through a communication link and performing several iteration to do decoding, the turbo decoder comprising:
   a first interleaver for receiving the systematic code and processing the systematic code into an interleaved systematic code;
   a first component decoder and a second component decoder for respectively getting first extrinsic information according to the systematic code, the first parity code and a first a-priori information and getting second extrinsic information according to the interleaved systematic code, the second parity code and a second a-priori information;
   a second interleaver for processing the first extrinsic information into the second a-priori information;
   a de-interleaver for processing the second extrinsic information into the first a-priori information, wherein the formats of the first extrinsic information and the second extrinsic information are respectively the same as formats of the first a-priori information and the second a-priori information; and
   a stop judging circuit, which comprises:
   a signal selector for responding with a first level of a select signal to select the first extrinsic information and the first a-priori information as a first output data and a second output data for output, and responding with a second level of the select signal to select the second extrinsic information and the second a-priori information as the first output data and the second output data for output;
   a difference detector for detecting a difference between the first output data and the second output data to get difference data; and a comparator for judging whether the difference data is smaller than a threshold value, and outputting a stopping signal to stop the iteration of the turbo decoder when the difference data is smaller than the threshold value; wherein the first component decoder and the second component decoder further respectively receive the first and the second a-priori information and adjust the new first extrinsic information and the new second extrinsic information to perform the iteration according to the first and the second a-priori information.

2. The turbo decoder according to claim 1, wherein the signal selector comprises:
   a first multiplexer for receiving the first extrinsic information and the second extrinsic information, and responding with the first level and the second level of the select signal to respectively provide the first extrinsic information and the second extrinsic information as the first output data for output; and
   a second multiplexer for receiving the first a-priori information and the second a-priori information and responding with the first level and the second level of the select signal to respectively provide the first a-priori information and the second a-priori information as the second output data for output.

3. The turbo decoder according to claim 1, wherein the difference detector comprises:
   a logic unit for performing an XOR logic operation according to the first output data and the second output data to get operation data;
   an accumulating unit for accumulating values of bits in the operation data to get the difference data.

4. The turbo decoder according to claim 1, wherein the second parity code is substantially equal to a parity code obtained by processing the interleaved systematic code.

5. An iteration stopping method applied to a turbo decoder to judge whether the turbo decoder has finished the decoding operation and to stop the decoding of the turbo decoder, the method comprising the steps of:
   (a) calculating first extrinsic information according to a systematic code, a first parity code and a first a-priori information;
   (b) calculating a difference data according to a difference between the first extrinsic information and a first a-priori information, and judging whether the difference data is smaller than a threshold value, wherein the first a-priori information corresponds to a second extrinsic information, which is calculated according to an interleaved systematic code, a second parity code and the second a-priori information; and
   (c) judging that the turbo decoder has finished the decoding operation and stopping the decoding operation when the difference data is smaller than the threshold value.

6. The method according to claim 5, further comprising, after step (b), the steps of:
   (c') calculating the second extrinsic information data again according to the interleaved systematic information, the second parity code and the second a-priori information when the difference data is greater than the threshold value;
   (d) calculating the difference data according to a difference between the second extrinsic information and the second a-priori information and judging whether the difference data is smaller than the threshold value and executing step (c) if the difference data is smaller than the threshold value, wherein the second a-priori information corresponds to the first extrinsic information.

7. The method according to claim 6, further comprising, after step (d), the step of:
   (e) calculating the first extrinsic information again according to the systematic code, the first parity code and the first a-priori information when the difference data is greater than the threshold value, and then executing step (b).

8. An iteration stopping method applied to a turbo decoder to judge whether a decoded data is converge, and to stop the iteration of the turbo decoder, the method comprising the steps of:
   (a) calculating first extrinsic information according to a systematic code, a first parity code and a first a-priori information which is preset to all zero;
   (b) judging whether a stopping signal is enabled;
   (c) judging whether difference data, which is obtained according to a difference between the first extrinsic information and the first a-priori information is smaller than a threshold value when the stopping signal is disabled, wherein the first a-priori information corresponds to a second extrinsic information, which is calculated according to a interleaved systematic code, a second parity code and the second a-priori information;
   (d) enabling the stopping signal when the difference data is smaller than the threshold value;
   (e) calculating the second extrinsic information again according to the interleaved systematic code, the second parity code and the second a-priori information;
   (f) judging whether the stopping signal is enabled; and
   (g) judging that the turbo decoder has finished the iteration and stopping the iteration of the turbo decoder when the stopping signal is enabled.

9. The method according to claim 8, further comprising, after step (f), the steps of:
- (g') judging whether the difference data, which is calculated according to a difference between the second extrinsic information and the second a-priori information, is smaller than the threshold value when the stopping signal is disabled, wherein the second a-priori information corresponds to the first extrinsic information; and
- (h) enabling the stopping signal when the difference data is smaller than the threshold value;
- (i) calculating the first extrinsic information again according to the systematic code, the first parity code and the first a-priori information, and executing step (b).

10. The method according to claim 9, further comprising, after step (g'), the step of:
executing step (i) when the difference data is greater than the threshold value.

11. The method according to claim 8, further comprising, after step (b), the step of: executing step (g) when the stopping signal is enabled.

12. The method according to claim 8, further comprising, after step (c), the steps of: executing step (e) when the difference data is greater than the threshold value.

13. A stop judging circuit used in a turbo decoder for stopping the stop an iteration of the turbo decoder, the stop judging circuit comprising:
- a signal selector for responding with a first level of a select signal to respectively select a first extrinsic information and a first a-priori information as a first output data and a second output data for output, and responding with a second level of the select signal to respectively select the second extrinsic information and the second a-priori information as the first output data and the second output data for output;
- a difference detector for detecting a difference between the first output data and the second output data to get difference data; and
- a comparator for judging whether the difference data is smaller than a threshold value, and outputting a stopping signal to stop the iteration of the turbo decoder when the difference data is smaller than the threshold value; wherein the turbo decoder comprises a first component decoder and a
- second component decoder, and the first and the second extrinsic information is respectively generated by the first component decoder based on a systematic code, a first parity code, and the first a-priori information and by the second component decoder based on an interleaved systematic code, a second parity code, and the second a-prior information; wherein the first component decoder and the second component decoder further respectively receive the first and the second a-priori information and adjust the new first extrinsic information and the new second extrinsic information to perform the iteration according to the first and the second a-priori information.

14. The stop judging circuit according to claim 13, wherein the signal selector comprises: a first multiplexer for receiving the first extrinsic information and the second extrinsic information, and responding with the first level and the second level of the select signal to respectively provide the first extrinsic information and the second extrinsic information as the first output data for output; and
- a second multiplexer for receiving the first a-priori information and the second a-priori information and responding with the first level and the second level of the select signal to respectively provide the first a-priori information and the second a-priori information as the second output data for output.

15. The turbo decoder according to claim 13, wherein the difference detector comprises: a logic unit for performing an XOR logic operation according to the first output data and the second output data to get operation data; an accumulating unit for accumulating values of bits in the operation data to get the difference data.

* * * * *